(12) United States Patent
Aitken et al.

(10) Patent No.: US 7,749,811 B2
(45) Date of Patent: Jul. 6, 2010

(54) TIN PHOSPHATE BARRIER FILM, METHOD, AND APPARATUS

(75) Inventors: Bruce Gardiner Aitken, Corning, NY (US); Chong Pyung An, Painted Post, NY (US); Benjamin Zain Hanson, Big Flats, NY (US); Mark Alejandro Quesada, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 79 days.

(21) Appl. No.: 12/553,469

(22) Filed: Sep. 3, 2009

(65) Prior Publication Data
US 2009/0324830 A1    Dec. 31, 2009

Related U.S. Application Data

(63) Continuation of application No. 11/509,445, filed on Aug. 24, 2006.

(51) Int. Cl.
    *H01L 21/00* (2006.01)
(52) U.S. Cl. ............. 438/115; 501/46; 438/106
(58) Field of Classification Search ................ 501/46; 438/106, 115
    See application file for complete search history.

(56) References Cited

U.S. PATENT DOCUMENTS

| | | | | |
|---|---|---|---|---|
| 3,719,477 A | * | 3/1973 | Lundin et al. | 420/491 |
| 3,720,097 A | | 3/1973 | Kron | 73/55 |
| 4,314,031 A | | 2/1982 | Sanford et al. | 501/44 |
| 4,379,070 A | | 4/1983 | Tick | 252/301.16 |
| 4,505,954 A | | 3/1985 | Hokamura et al. | 427/380 |
| 4,997,718 A | * | 3/1991 | Dumesnil et al. | 428/426 |
| 5,013,360 A | | 5/1991 | Finkelstein et al. | 106/1.23 |

(Continued)

FOREIGN PATENT DOCUMENTS

EP    1 207 572    5/2002

(Continued)

OTHER PUBLICATIONS

A. Köhler et al., "Fluorescence and Phosphorescence in Organic Materials", Advanced Engineering Materials, 2002, vol. 4, No. 7, pp. 453-459.

(Continued)

*Primary Examiner*—Thanh V Pham
*Assistant Examiner*—Caleb Henry
(74) *Attorney, Agent, or Firm*—Kevin M. Able; Keith W. Hathcock

(57) ABSTRACT

A method is disclosed for inhibiting oxygen and moisture penetration of a device comprising the steps of depositing a tin phosphate low liquidus temperature (LLT) inorganic material on at least a portion of the device to create a deposited tin phosphate LLT material, and heat treating the deposited LLT material in a substantially oxygen and moisture free environment to form a hermetic seal; wherein the step of depositing the LLT material comprises the use of a resistive heating element comprising tungsten. An organic electronic device is also disclosed comprising a substrate plate, at least one electronic or optoelectronic layer, and a tin phosphate LLT barrier layer, wherein the electronic or optoelectronic layer is hermetically sealed between the tin phosphate LLT barrier layer and the substrate plate. An apparatus is also disclosed having at least a portion thereof sealed with a tin phosphate LLT barrier layer.

19 Claims, 3 Drawing Sheets

U.S. PATENT DOCUMENTS

| | | | | |
|---|---|---|---|---|
| 5,188,990 | A * | 2/1993 | Dumesnil et al. | 501/19 |
| 5,281,560 | A | 1/1994 | Francis et al. | 501/15 |
| 6,077,928 | A | 6/2000 | Suh et al. | 528/170 |
| 6,171,703 | B1 | 1/2001 | Haluska | 428/446 |
| 6,193,379 | B1 | 2/2001 | Tonar et al. | 359/603 |
| 6,207,488 | B1 | 3/2001 | Hwang et al. | 438/240 |
| 6,211,560 | B1 | 4/2001 | Jimenez et al. | 257/451 |
| 6,235,579 | B1 | 5/2001 | Lou | 438/253 |
| 6,249,014 | B1 | 6/2001 | Bailey | 257/295 |
| 6,288,415 | B1 | 9/2001 | Leong et al. | 257/94 |
| 6,294,420 | B1 | 9/2001 | Tsu et al. | 438/239 |
| 6,321,571 | B1 | 11/2001 | Themont et al. | 65/155 |
| 6,355,125 | B1 | 3/2002 | Tahon et al. | 156/99 |
| 6,413,645 | B1 | 7/2002 | Graff et al. | 428/446 |
| 6,486,549 | B1 | 11/2002 | Chiang | 257/723 |
| 6,522,067 | B1 | 2/2003 | Graff et al. | 313/512 |
| 6,573,652 | B1 | 6/2003 | Graff et al. | 313/512 |
| 6,664,730 | B2 | 12/2003 | Weaver | 313/504 |
| 6,720,097 | B2 | 4/2004 | Ohkawa et al. | 428/701 |
| 6,720,203 | B2 | 4/2004 | Carcia et al. | 438/99 |
| 2001/0005585 | A1 | 6/2001 | Ashihara et al. | 435/7.95 |
| 2001/0013756 | A1 | 8/2001 | Mori et al. | 313/512 |
| 2001/0033135 | A1 | 10/2001 | Duggal et al. | 313/506 |
| 2001/0038894 | A1 | 11/2001 | Komada | 428/34.6 |
| 2001/0054436 | A1 | 12/2001 | Mukai et al. | 136/256 |
| 2002/0013042 | A1 | 1/2002 | Morkoc | 438/604 |
| 2002/0041443 | A1 | 4/2002 | Varaprasad et al. | 359/603 |
| 2002/0074553 | A1 | 6/2002 | Starikov et al. | 257/77 |
| 2002/0076154 | A1 | 6/2002 | Maisenhoelder et al. | 385/37 |
| 2002/0122649 | A1 | 9/2002 | Shimizu et al. | 385/129 |
| 2002/0127341 | A1 | 9/2002 | Li | 427/385.5 |
| 2002/0140347 | A1 | 10/2002 | Weaver | 313/506 |
| 2002/0160137 | A1 | 10/2002 | Varma | 428/35.7 |
| 2003/0006697 | A1 | 1/2003 | Weaver | 313/503 |
| 2003/0019517 | A1 | 1/2003 | McFarland | 136/256 |
| 2003/0020099 | A1 | 1/2003 | Taylor | 257/215 |
| 2003/0022919 | A1 | 1/2003 | Ayers et al. | 512/317 |
| 2003/0032039 | A1 | 2/2003 | Cunningham et al. | 435/6 |
| 2003/0044552 | A1 | 3/2003 | Komada | 428/35.7 |
| 2003/0049942 | A1 | 3/2003 | Haukka et al. | 438/778 |
| 2003/0075753 | A1 | 4/2003 | Chu | 257/308 |
| 2003/0080678 | A1 | 5/2003 | Kim et al. | 313/504 |
| 2003/0085652 | A1 | 5/2003 | Weaver | 313/506 |
| 2003/0087513 | A1 | 5/2003 | Noguchi et al. | 438/627 |
| 2003/0143423 | A1 | 7/2003 | McCormick et al. | 428/690 |
| 2003/0152803 | A1 | 8/2003 | Acchione | 428/690 |
| 2003/0155860 | A1 | 8/2003 | Choi et al. | 313/498 |
| 2003/0184219 | A1 | 10/2003 | Duggal et al. | 313/506 |
| 2003/0193057 | A1 | 10/2003 | Humbs et al. | 257/88 |
| 2003/0193286 | A1 | 10/2003 | Ottermann et al. | 313/506 |
| 2003/0197197 | A1 | 10/2003 | Brown et al. | 257/200 |
| 2003/0203210 | A1 | 10/2003 | Graff | 428/412 |
| 2003/0207500 | A1 | 11/2003 | Pichler et al. | 438/127 |
| 2003/0214612 | A1 | 11/2003 | Freeman | 349/12 |
| 2003/0234180 | A1 | 12/2003 | Shimizu et al. | 205/80 |
| 2004/0019596 | A1 | 1/2004 | Taylor et al. | 707/100 |
| 2004/0046497 | A1 | 3/2004 | Schaepkens et al. | 313/506 |
| 2004/0046500 | A1 | 3/2004 | Stegamat | 313/512 |
| 2004/0051449 | A1 | 3/2004 | Klausmann et al. | 313/512 |
| 2004/0067604 | A1 | 4/2004 | Ouellet et al. | 438/108 |
| 2004/0075382 | A1 | 4/2004 | Stegamat et al. | 313/506 |
| 2004/0092095 | A1 | 5/2004 | Nguyen et al. | 438/627 |
| 2004/0097005 | A1 | 5/2004 | Daniels et al. | 438/99 |
| 2004/0100176 | A1 | 5/2004 | Pichler | 313/112 |
| 2004/0113543 | A1 | 6/2004 | Daniels | 313/504 |
| 2004/0115361 | A1 | 6/2004 | Aegerter et al. | 427/430.1 |
| 2004/0119403 | A1 | 6/2004 | McCormick et al. | 313/506 |
| 2004/0121586 | A1 | 6/2004 | Abell | 438/637 |
| 2004/0132606 | A1 | 7/2004 | Wolf et al. | 501/66 |
| 2004/0135268 | A1 | 7/2004 | Frischknecht | 257/788 |
| 2004/0135503 | A1 | 7/2004 | Handa et al. | 313/511 |
| 2004/0151934 | A1 | 8/2004 | Schwark et al. | 428/518 |
| 2004/0157426 | A1 | 8/2004 | Ouellet et al. | 438/618 |
| 2004/0166239 | A1 | 8/2004 | Ohkawa et al. | 427/248.1 |
| 2004/0197489 | A1 | 10/2004 | Heuser et al. | 427/535 |
| 2004/0201027 | A1 | 10/2004 | Ghosh | 257/99 |
| 2004/0201348 | A1 | 10/2004 | Anandan | 313/512 |
| 2004/0206953 | A1 | 10/2004 | Morena et al. | 257/40 |
| 2004/0207314 | A1 | 10/2004 | Aitken et al. | 313/504 |
| 2004/0234797 | A1 | 11/2004 | Schwark et al. | 428/474.4 |

FOREIGN PATENT DOCUMENTS

| | | |
|---|---|---|
| EP | 0 977 469 | 9/2003 |
| EP | 0 726 579 | 11/2003 |
| EP | 0775 328 | 3/2004 |
| JP | 2005-306010 | 11/2005 |
| WO | WO 00/20536 | 4/2000 |
| WO | WO 01/05205 | 1/2001 |
| WO | WO 01/65167 | 9/2001 |
| WO | WO 01/83067 | 11/2001 |
| WO | WO 02/36647 | 5/2002 |
| WO | WO 2004/046767 | 6/2004 |
| WO | WO 2004/079781 | 9/2004 |
| WO | WO 2004/094321 | 11/2004 |
| WO | WO 2004/095597 | 11/2004 |

OTHER PUBLICATIONS

R.A. Mathies et al., "Optimization of High-Sensitivity Fluorescence Detection", Anal. Chem., 1990, vol. 62, pp. 1786-1791.

P.K.H. Ho et al., "All-Polymer Optoelectronic Devices", Science, vol. 285, Jul. 9, 1999, pp. 233-236.

H. Aziz et al., "Degradation Mechanism of Small Molecule-Based Organic Light-Emitting Devices", Science, Mar. 19, 1999, vol. 283, pp. 1900-1902.

P.E. Burrows et al., "Reliability and degradation of organic light emitting devices", Appl. Phys. Lett., vol. 65, No. 23, Dec. 5, 1994, pp. 2922-2924.

P.A. Tick et al., "Optical Waveguides from Low Melting Temperature Glasses with Organic Dyes", SPIE, vol. 1775, Nonlinear Optical Properties of Organic Materials V, 1992, pp. 391-401.

Hood Chatham, "Oxygen Diffusion Barrier Properties of Transparent Oxide Coatings on Polymeric Substrates", Surface and Coatings Technology, vol. 78, 1996, pp. 1-9.

D.B. Curliss et al., "Cure Reaction Pathways of Bismaleimide Polymers: A Solid-State $^{15}N$ NMR Investigation", Macromolecules, 1998, vol. 31, pp. 6776-6782.

N. Regnier et al., "Solid-State $^{13}C$-NMR Study on Bismaleimide/Diamine Polymerization: Structure, Control of Particle Size, and Mechanical Properties", Journal of Applied Polymer Science, vol. 78, 2000, pp. 2379-2388.

A. Ashok Kumar et al., "Synthesis and Characterization of Siliconized Epoxy-1, 3-bis(maleimido)benzene Intercrosslinked Matrix Materials", Polymer, vol. 43, 2002, pp. 693-702.

M. Sava, "Synthesis of Bismaleimides with Ester Units and Their Polymerization with Diamines", Journal of Applied Polymer Science, vol. 84, 2002, pp. 750-757.

MIT Internet Class 6.976, Lecture #7, "Special Topics in Flat Panel Display", Spring 2001, http://hackman.mit.edu\6976\LIIandouts\Lecture%207.pdf\.

A.C. Misra et al., "Synthesis and properties of octafluoro-benzidine bis-maleimide and of it reaction products with fluorinated diamines", Polymer, 1992, vol. 33, No. 5, pp. 1083-1089.

A.C. Misra et al., "Synthesis and properties of some new fluorine-containing polyimides", Polymer, 1992, vol. 33, No. 5, pp. 1078-1082.

J.E. White et al., "Polymerization of N,N'-bismaleimido-4,4'-diphenylmethane with arenedithiols. Synthesis of some new polyimidosulphides", Polymer, 1984, vol. 25, pp. 850-854.

Glocker, D.A.S., S. Ismat, ed. *Handbook of Thin Film Process Technology*—vols. 1 and 2. 2002, Institute of Physics: Bristol and Philadelphia.

Vossen, J.L.K., Werner, ed. *Thin Film Processes II*. 1991, Academic Press: San Diego.

Chatham, H., *Oxygen diffusion barrier properties of transparent oxide coatins on polymeric substrates: Review*. Surface and Coatings Technology, 1996. 78: p. 1.

Gordon L. Graff, P.E.B., Rick E. Williford, Rboert F. Paraino, *Barrier Layer Technology for Flexible Displays*, in *Flexible Flat Panel Displays*, G.P. Crawford, Editor. 2005, John Wiley & Sons, Ltd: West Sussex, England.

Crawford, G.P., ed. *Flexible Flat Panel Displays*, Wiley-SID Series in Display Technology, ed. A.C. Lowe. 2005, John Wiley & Sons Ltd.: Chippenham-Wiltshire.

Aitken, B.L., Mark A; Quesada, Mark A., *Method for Inhibiting Oxygen and Moisture Degradation of a Device and the Resulting Device*, U.S.P. Office, Editor. 2005, Corning Incorporated: USA.

Crank, J., *The Mathematics of Diffusion*. Second Edition ed. 1975: Oxford University Press.

Vieth, W.R., *Diffusion in and through Polymers: Principles and Applications*. 1991: Hanser Gardner Publications.

Madou, M., *Fundamentals of Microfabrication*. 1997, Boca Raton: CRC Press LLC.

\* cited by examiner

TIN PHOSPHATE BARRIER FILM, METHOD, AND APPARATUS

CROSS-REFERENCE TO RELATED APPLICATIONS

This application is a continuation of and claims the benefit of priority to U.S. patent application Ser. No. 11/509,445, filed on Aug. 24, 2006, the content of which is relied upon and incorporated herein by reference in its entirety.

BACKGROUND OF THE INVENTION

1. Field of the Invention

The present invention relates to a method for inhibiting oxygen and moisture penetration, and the subsequent degradation of a device or apparatus.

2. Technical Background

The transport of oxygen or moisture through laminated or encapsulated materials and the subsequent attack of an inner material(s) represent two of the more common degradation mechanisms associated with many devices such as, for example, light-emitting devices (OLED devices), thin-film sensors, and evanescent waveguide sensors. The operational lifetime of such devices can be greatly increased if steps are taken to minimize the penetration of oxygen and/or moisture.

Existing efforts to extend the lifetime of such devices include gettering, encapsulation and extensive device sealing techniques. Common techniques for sealing devices, such as OLEDs, include the use of epoxies and inorganic and/or organic materials that form a hermetic seal upon curing by exposure to heating or to ultra-violet light. Although such seals provide some level of hermetic behavior, they can be expensive and do not assure hermetic seals will be maintained through prolonged operation.

Similar oxygen and moisture penetration problems are common in other devices, such as thin-film sensors, evanescent waveguide sensors, food containers and medicine containers. Accordingly, there is a need to inhibit the penetration of oxygen and moisture into all such devices. This need and other needs are satisfied by the present invention.

SUMMARY OF THE INVENTION

In a first aspect, the present invention provides a method of inhibiting oxygen and moisture penetration of a device, comprising the steps of: depositing a tin phosphate low liquidus temperature inorganic material on at least a portion of the device to create a deposited low liquidus temperature inorganic material; and heat treating the deposited low liquidus temperature inorganic material in a substantially oxygen and moisture free environment to form a hermetic seal; wherein the step of depositing the low liquidus temperature inorganic material comprises the use of a resistive heating element comprising tungsten.

In another aspect, the present invention provides a device produced by the methods of the present invention.

In another aspect, the present invention provides an organic electronic device comprising a substrate plate; at least one organic electronic or optoelectronic layer; and a tin phosphate low liquidus temperature barrier layer, wherein the electronic or optoelectronic layer is hermetically sealed between the tin phosphate low liquidus temperature barrier layer and the substrate plate.

In yet another aspect, the present invention provides an apparatus having at least a portion thereof sealed with a tin phosphate low liquidus temperature barrier layer.

Additional aspects of the invention will be set forth, in part, in the detailed description, figures and any claims which follow, and in part will be derived from the detailed description, or can be learned by practice of the invention. It is to be understood that both the foregoing general description and the following detailed description are exemplary and explanatory only and are not restrictive of the invention as disclosed.

BRIEF DESCRIPTION OF THE DRAWINGS

The accompanying drawings, which are incorporated in and constitute a part of this specification, illustrate certain aspects of the present invention and together with the description, serve to explain, without limitation, the principles of the invention.

DETAILED DESCRIPTION OF THE INVENTION

Figure 1:
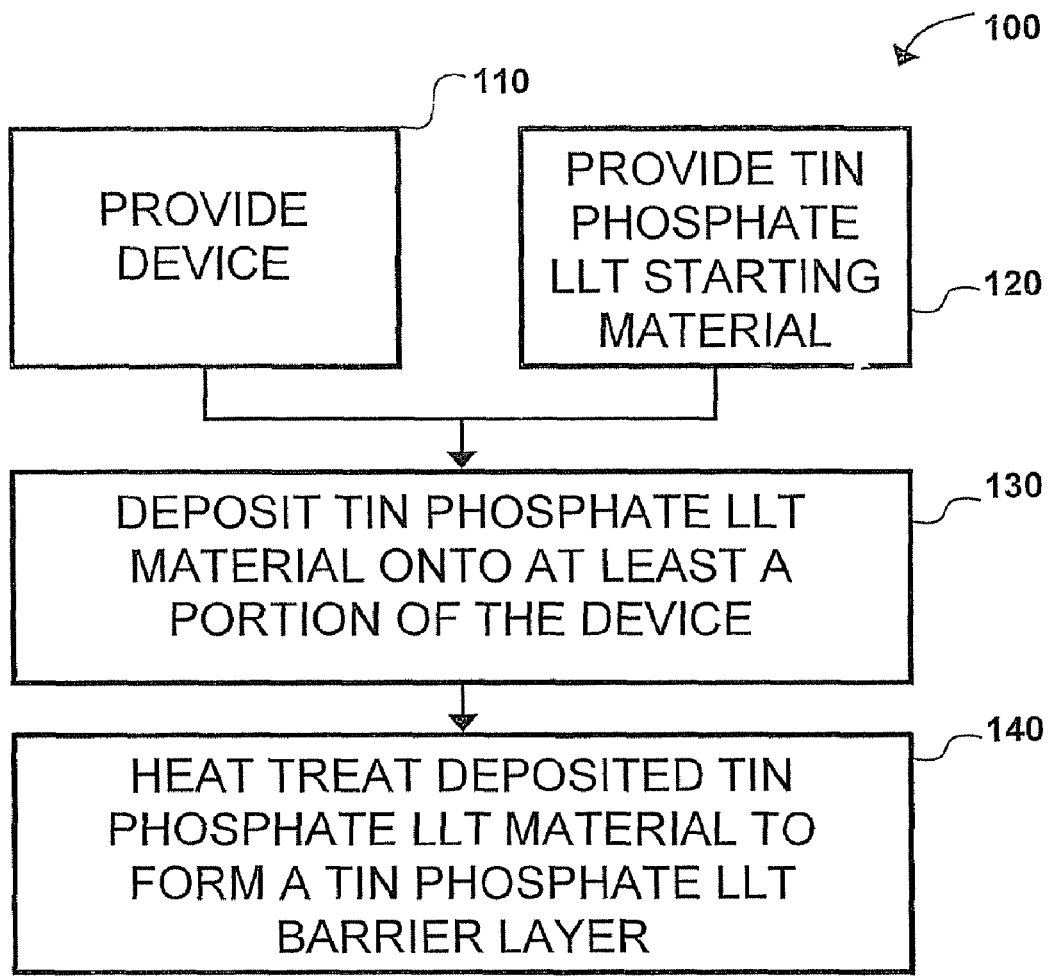
FIG. 1 is a schematic illustration of an exemplary process of forming a tin phosphate LLT barrier layer on at least a portion of a device, in accordance with one aspect of the present invention.

The present invention can be understood more readily by reference to the following detailed description, examples, and claims, and their previous and following description. However, before the present device and/or methods are disclosed and described, it is to be understood that this invention is not limited to the specific devices and/or methods disclosed unless otherwise specified, as such can, of course, vary. It is also to be understood that the terminology used herein is for the purpose of describing particular aspects only and is not intended to be limiting.

Disclosed are materials, compounds, compositions, and components that can be used for, can be used in conjunction with, can be used in preparation for, or are products of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. For example, if a class of components A, B, and C are disclosed as well as a class of components D, E, and F and an example of a combination molecule, A-D is disclosed, then even if each is not individually recited, each is individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to, steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

The following description of the invention is provided as an enabling teaching of the invention in its currently known embodiment. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

In this specification and in the claims which follow, reference will be made to a number of terms which shall be defined to have the following meanings:

As used herein, the singular forms "a," "an" and "the" include plural referents unless the context clearly dictates otherwise. Thus, for example, reference to a "low liquidus temperature inorganic material" includes aspects having two or more such materials, unless the context clearly indicates otherwise.

"Optional" or "optionally" means that the subsequently described event or circumstance can or cannot occur, and that the description includes instances where the event or circumstance occurs and instances where it does not. For example, the phrase "optionally substituted component" means that the component can or can not be substituted and that the description includes both unsubstituted and substituted components.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, a "wt. %" or "weight percent" or "percent by weight" of a component, unless specifically stated to the contrary, refers to the ratio of the weight of the component to the total weight of the composition in which the component is included, expressed as a percentage.

As used herein, unless specifically stated to the contrary, the terms "low liquidus temperature inorganic material", "low liquidus temperature material", and "LLT material" refer to a material with a melting point ($T_m$) or glass transition temperature ($T_g$) less than about 1,000° C.

As used herein, a "starting" material refers to a material that will be evaporated and deposited onto a device.

As used herein, a "deposited" material refers to a material that has been deposited on a device or apparatus.

As used herein, a "barrier layer" refers to a hermetic coating, and specifically herein a deposited tin phosphate LLT material that has been heat treated to an temperature effective to form a hermetic seal.

As briefly introduced above, the present invention provides an improved method for forming a tin phosphate LLT barrier layer on a device or apparatus. Among other aspects described in detail below, the inventive method comprises the deposition of a tin phosphate LLT starting material onto at least a portion of a device or apparatus to form a deposited LLT material, and heat treatment of the deposited tin phosphate LLT material to remove defects and/or pores and form a tin phosphate LLT barrier layer.

The tin phosphate LLT material can be deposited onto the device by, for example, thermal evaporation, co-evaporation, laser ablation, flash evaporation, vapor-deposition, electron beam irradiation, or a combination thereof. Defects and/or pores in the tin phosphate LLT material can be removed by a consolidation or heat treatment step to produce a pore-free or substantially pore-free, oxygen and moisture impenetrable protective coating on the device. Although many deposition methods are possible with common glasses i.e. those having high melting temperatures), the consolidation step is only practical with a tin phosphate LLT material where the consolidation temperature is sufficiently low so as to not damage the inner layers in the device. In some aspects, the deposition step and/or heat treatment step take place in a vacuum, in an inert atmosphere, or in ambient conditions depending upon the tin phosphate LLT material's composition.

With reference to the drawings, the flowchart of FIG. 1 illustrates the steps of an exemplary method 100 for forming a tin phosphate LLT barrier layer on a device. Beginning at steps 110 and 120, a device and a tin phosphate LLT starting material are provided so that one can form the desired tin phosphate LLT barrier layer on a device. At step 130, the tin phosphate LLT starting material is evaporated to deposit tin phosphate LLT material on at least a portion of the device. Depending on the specific material and deposition conditions, the deposited tin phosphate LLT material can contain pores and can be remain permeable to oxygen and moisture. At step 140, the deposited tin phosphate LLT material is heat treated to a temperature sufficient to remove pores, for example, a temperature approximately equal to the glass transition temperature of the deposited tin phosphate LLT material, and form a hermetic seal or tin phosphate LLT barrier layer, which can prevent oxygen and moisture penetration into the device.

The steps of the exemplary method are not intended to be limiting and can be performed in various orders. For example step 110 can be performed before, after, or simultaneous to step 120.

Devices

The device of the present invention can be any such device where at least a portion of the device is sensitive to oxygen and/or moisture, for example, an organic-electronic device, such as an organic light emitting diode ("OLED"), a polymer light emitting diode ("PLED"), or a thin film transistor; a thin film sensor; an optoelectronic device, such as an optical switch or an evanescent waveguide sensor; a photovoltaic device; a food container; or a medicine container.

In one aspect, the device is an OLED device that has multiple inner layers, including a cathode and an electro-luminescent material, which are located on a substrate. The substrate can be any material suitable for fabricating and sealing a device. In one aspect, the substrate is glass. In another aspect, the substrate can be a flexible material. In one aspect, the LLT material is deposited prior to the deposition of an organic electro-luminescent material.

In another aspect, the device is an organic electronic device comprising a substrate, as described above, and at least one organic electronic or optoelectronic layer. In a further aspect, the device is coated with a tin phosphate LLT barrier layer, wherein the organic electronic or optoelectronic layer is hermetically sealed between the substrate and the tin phosphate LLT barrier layer. In a further aspect, the hermetic seal is created by the deposition and heat treatment of a tin phosphate LLT material.

In another aspect, at least a portion of the device is sealed with a tin phosphate LLT material, wherein the tin phosphate LLT material comprises tin phosphate material.

Figure 2:
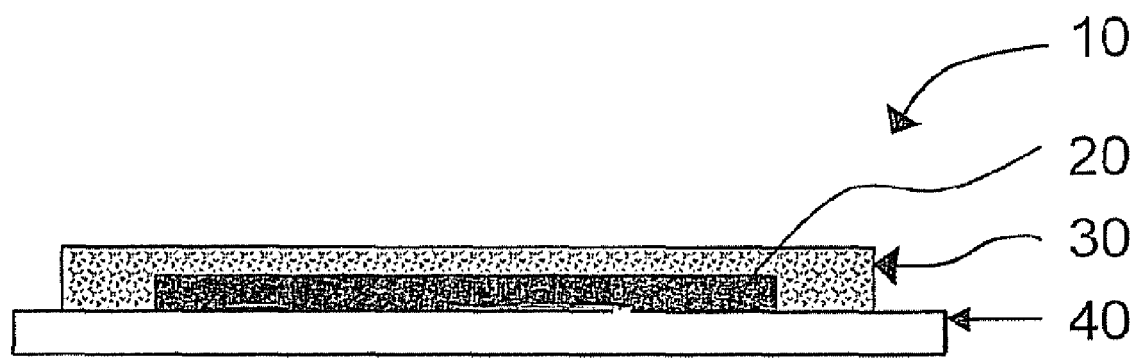
FIG. 2 is a schematic of an exemplary device onto which a tin phosphate LLT barrier layer has been formed, in accordance with another aspect of the present invention.

With reference again to the drawings, FIG. 2 depicts an exemplary cross-sectional side view of a device coated with a tin phosphate LLT barrier layer. The exemplary coated device 10 of FIG. 2 includes a substrate 40, an optoelectronic layer 20 that is sensitive to oxygen and/or moisture, and a tin phosphate LLT barrier layer 30 that provides a hermetic seal between the optoelectronic layer 20 and environmental oxygen and moisture.

Tin Phosphate Low Liquidus Temperature Inorganic Starting Material

In the present invention, the physical properties, such as low glass transition temperature, of a low liquidus temperature inorganic material facilitate the formation of a hermetic seal. In one aspect of the present invention, a tin phosphate low liquidus temperature inorganic starting material, or LLT starting material, can be deposited onto a least a portion of a device and the deposited material heat treated at a relatively low temperature to obtain a pore-free or substantially pore-free barrier layer, without thermally damaging the device's inner layer(s). It should be appreciated that the deposited and heat treated low liquidus temperature inorganic material can be used as a barrier layer on a wide variety of devices.

In one aspect, the tin phosphate LLT starting material has a glass transition temperature of less than about 1000° C., preferably less than about 600° C., and more preferably less than about 400° C.

In another aspect, the tin phosphate LLT starting material is substantially free of fluorine, preferably containing less than one weight percent fluorine, and more preferably being free of fluorine. In another aspect, the tin phosphate LLT starting material comprises tin, phosphorus, and oxygen. Exemplary tin phosphate LLT starting materials include, tin meta-phosphate, tin ortho-hydrogenphosphate, tin ortho-dihydrogenphosphate, tin pyrophosphate, or a mixture thereof. It is preferred that the tin phosphate LLT starting material be a tin pyrophosphate.

It is understood that the stoichiometry of the deposited tin phosphate LLT material can vary from that of the tin phosphate LLT starting material. For example, evaporation of a tin pyrophosphate can produce a deposited material that is depleted or enriched in phosphorus relative to tin pyrophosphate. In various aspects, the deposited tin phosphate LLT material can have a tin concentration that is lower than, equal to, or higher than that of the tin phosphate LLT starting material. It can be advantageous if the deposited tin phosphate LLT material has a tin concentration higher than that of the tin phosphate LLT starting material. It is preferable that the deposited tin phosphate LLT material have a tin concentration at least as high as that of the tin phosphate LLT starting material. It is also preferable that the deposited tin phosphate LLT material have substantially the same low liquidus temperature as the tin phosphate LLT starting material. It is also preferable that the tin phosphate LLT starting material comprise divalent tin.

The tin phosphate LLT starting material of the present invention can be crystalline, amorphous, glassy, or a mixture thereof. In one aspect, the tin phosphate LLT starting material can comprise at least one crystalline component. In another aspect, the tin phosphate LLT starting material can comprise at least one amorphous component. In yet another aspect, the LLT starting material can comprise at least one glassy component.

In one aspect, the tin phosphate LLT starting material is a single tin phosphate LLT material such as, for example, tin meta-phosphate, tin ortho-hydrogen phosphate, tin ortho-dihydrogen phosphate, or tin pyrophosphate. In another aspect, the tin phosphate LLT starting material can comprise a mixture of components. In another aspect, the tin phosphate LLT starting material can comprise a glass, formed by mixing at least two tin phosphate LLT materials, heating the materials to fuse them together, and quenching the resulting mixture to form a glass.

The tin phosphate LLT starting material can further comprise a tin oxide. In one aspect, the tin oxide material can comprise from about 60 to about 85 mole percent of the tin phosphate LLT starting material.

The tin phosphate LLT starting material can further comprise additives and/or other low liquidus temperature materials. In one aspect, the tin phosphate LLT starting material comprises a niobium containing compound. In a further aspect, the tin phosphate LLT starting material comprises niobium oxide, at an amount from greater than 0 to about 10 weight percent, preferably at an amount from greater than 0 to about 5 weight percent, and more preferably at about 1 weight percent.

Tin phosphate LLT starting materials are commercially available, for example, from Alfa Aesar, Ward Hill, Mass., USA. One of ordinary skill in the art should be able to readily select an appropriate tin phosphate starting material.

Deposition of Tin Phosphate LLT Starting Material

In the present invention, the tin phosphate LLT starting material can be deposited onto at least a portion of a device by an evaporative process, such as thermal evaporation. The evaporation and deposition steps of the present invention are not limited to any specific equipment or geometric arrangement. It should be noted that the evaporation and deposition steps can be referred to a separate steps or as a combined step. Once a tin phosphate LLT starting material is volatilized, the evaporated material will typically deposit on surfaces proximally located to the resistive heating element. Commonly used evaporation systems operate under vacuum at pressures, for example, from about $10^{-8}$ to about $10^{-5}$ Torr and are fitted with leads to provide electrical current to a resistive heating element. Evaporation can also be performed in an inert atmosphere to ensure substantially oxygen and moisture free conditions are maintained throughout the evaporation, deposition, and sealing process. Unless required by the nature of the device to be coated, it is not necessary that the deposition and/or heat treatment environment be completely free of oxygen and moisture, and so, the environment can be free of or substantially free of oxygen and moisture. A variety of resistive heating elements can be employed, including boats, ribbons, or crucibles. In a typical evaporation process, the tin phosphate LLT starting material can be placed in contact with the resistive heating element. Current, typically in the range of 80 to 180 Watts, is subsequently passed through the resistive heating element, resulting in volatilization of the tin phosphate LLT starting material. The power required to evaporate a specific material will vary, depending on the material itself, the pressure, and the resistance of the heating element. The rate and length of time of a specific deposition will vary, depending upon the materials, deposition conditions, and the desired thickness of the deposited layer. Evaporation systems are commercially available, for example, from Kurt J. Lesker Company, Clairton, Pa., USA. One of ordinary skill in the art could readily select an evaporation system and the operating conditions necessary to deposit a tin phosphate LLT material.

In one aspect, a single layer of a tin phosphate LLT material can be deposited on at least a portion of a substrate. In another aspect, multiple layers of the same or varying types of tin phosphate LLT material can be deposited over one or more inner layers, positioned on top of a substrate.

In one aspect, the present invention comprises a resistive heating element comprised of tungsten. The geometry of the evaporative system and of the resistive heating element can vary. In one aspect the resistive tungsten heating element is a boat. In another aspect, the resistive tungsten heating element is a ribbon. One of ordinary skill in the art should readily be able to select an appropriate evaporative system and resisting tungsten heating element.

Evaporation of a tin phosphate LLT starting material from a resistive tungsten heating element provides high, steady state, deposition rates that are difficult to achieve with other LLT starting materials or deposition techniques. For example, a deposition rate as high as 15 Å per second is attainable using a tin pyrophosphate LLT starting material and a small tungsten boat. The ability to deposit tin phosphate LLT starting materials at such rates makes feasible the commercial fabrication of flexible substrates that are able to withstand high processing temperatures.

Properties of Deposited Tin Phosphate LLT Material

The deposited tin phosphate LLT material can optionally further comprise a tin oxide. In one aspect, the deposited tin phosphate LLT material can comprise from about 60 to about 85 mole percent tin oxide. As described above, the specific chemical structure and stoichiometry of the deposited tin phosphate LLT material can vary from that of the tin phosphate LLT starting material. The presence of tin oxide in the deposited tin phosphate LLT material can result from the optional addition of a tin oxide material to the tin phosphate LLT starting material, or from chemical and/or stoichiometric changes occurring during the deposition process or on the surface of the device.

In one aspect, the deposited tin phosphate LLT material comprises divalent tin, a higher valence tin compound, for example, a $Sn^{+4}$ compound, or a mixture of thereof. In one aspect, the presence of a $Sn^{+4}$ compound in the deposited LLT material provides enhanced durability.

Evaporation of a tin phosphate LLT starting material using a resistive tungsten heating element can lead to a chemical or physical reaction between the tin phosphate LLT starting material and the resistive tungsten heating element, wherein at least a portion of the tungsten can be deposited together with the tin phosphate LLT starting material. In one aspect, the deposited tin phosphate LLT material comprises from greater than 0 to about 10 weight percent tungsten, preferably from about 2 to about 7 weight percent tungsten. In another aspect, a reaction between a tin phosphate LLT starting material, such as for example, tin pyrophosphate, and a tungsten heating element results in the formation of a green glassy material which comprises tungsten.

In another aspect, the deposited tin phosphate LLT material can contain other materials to provide improved strength or resistance to permeability, or to alter the optical properties of the device. These materials can be evaporated together with the tin phosphate LLT starting material. In one aspect, the deposited tin phosphate LLT material can contain niobium, for example, in the form of niobium oxide. Niobium oxide is commercially available from Alfa Aesar, Ward Hill, Mass., USA. One of ordinary skill in the art could readily select an appropriate additional material, such as a niobium oxide. In yet another aspect, the deposited tin phosphate LLT material comprises a tin phosphate, niobium, and tungsten.

Heat Treatment and Formation of a Tin Phosphate LLT Barrier Layer

A heat treatment or annealing step minimizes defects and pores in the deposited layer of tin phosphate LLT material, allowing the formation of a hermetic seal or tin phosphate LLT barrier layer. In one aspect, the heat treated tin phosphate LLT barrier layer is pore-free or substantially pore-free. The number and/or size of pores remaining in the heat treated tin phosphate LLT barrier layer should be sufficiently low to prevent oxygen and moisture penetration. In one aspect, the heat treatment is performed under vacuum. In another aspect, the heat treatment step is performed in an inert atmosphere. It should be appreciated that the heat treatment step can be performed in the same system and immediately subsequent to the deposition step, or at a separate time and place provided that environmental conditions are maintained to prevent oxygen and moisture intrusion into the device.

The heat treatment step of the present invention comprises heating the device onto which a tin phosphate LLT material has been deposited. In one aspect, the temperature to which the device and deposited tin phosphate LLT material are exposed is approximately equal to the glass transition temperature, or $T_g$, of the deposited tin phosphate LLT material. In another aspect, the temperature to which the device and deposited tin phosphate LLT material are exposed is within approximately 50° C. of the glass transition temperature, or $T_g$, of the deposited tin phosphate LLT material. In another aspect, the temperature to which the device and deposited tin phosphate LLT material are exposed is from about 200° C. to about 350° C., for example, 200, 225, 250, 275, 300, 325, or 350° C. In yet another aspect, the temperature to which the device and deposited tin phosphate LLT material are exposed is from about 250° C. to about 270° C. It will be appreciated that the ideal time and temperature to which a device and deposited tin phosphate LLT material are exposed will vary, depending on factors such as the composition of the deposited tin phosphate LLT material, the working temperature range of the components to be sealed, and the desired thickness and permeability of the hermetic seal. The heat treatment step can be performed by any heating means that can achieve the desired temperature and maintain a substantially oxygen and moisture free environment. In one aspect, the heat treatment step comprises heating the device with an infrared lamp positioned in the vacuum deposition chamber. In another aspect, the heat treatment step comprises raising the temperature of the vacuum deposition chamber in which the device is located. The heat treatment step can be performed separately from the deposition step, provided that a substantially oxygen and moisture free environment is maintained. It is preferable that the heat treatment conditions be sufficient to allow the resulting device to meet desired performance criteria, such as the calcium patch test described below. One of ordinary skill in the art could readily choose appropriate heat treatment conditions to for a hermetic seal without damage to the device.

The thickness of the tin phosphate LLT barrier layer can be any such thickness required to provide the desired hermetic seal. In one aspect, the tin phosphate LLT barrier layer is about 1 micrometer thick. In another aspect, the tin phosphate LLT barrier is about 2.5 micrometers thick.

In one aspect, the tin phosphate LLT barrier layer is at least partially transparent to radiation either emitted by or absorbed by the device. In another aspect, the tin phosphate LLT barrier layer is at least partially transparent to visible light.

Evaluation of Barrier Layer

The hermeticity of a tin phosphate LLT barrier layer can be evaluated using various methods to test the hermeticity of the tin phosphate LLT barrier layer to oxygen and/or moisture. In one aspect, the tin phosphate LLT barrier layer can be evaluated using a calcium patch test, wherein a thin calcium film is deposited onto a substrate. A tin phosphate LLT barrier layer is then formed, sealing the calcium film between the tin phosphate LLT barrier layer and the substrate. The resulting device is then subjected to environmental aging at a selected temperature and humidity, for example, 85° C. and 85% relative humidity. If oxygen and/or moisture penetrate the tin phosphate LLT barrier layer, the highly reflective calcium film will react, producing an easily identifiable opaque white crust. It is generally recognized in the display industry that calcium patch survival for about 1,000 hours in an 85° C., 85% relative humidity environment indicates the hermetic layer can prevent oxygen and water permeation for at least about 5 years.

EXAMPLES

To further illustrate the principles of the present invention, the following examples are put forth so as to provide those of ordinary skill in the art with a complete disclosure and description of how the devices and methods claimed herein are made and evaluated. They are intended to be purely exemplary of the invention and are not intended to limit the scope of what the inventors regard as their invention. Efforts have been made to ensure accuracy with respect to numbers (e.g., amounts, temperatures, etc.); however, some errors and deviations can have occurred. Unless indicated otherwise, percents are weight percent, and temperature is ° C. or is at ambient temperature. There are numerous variations and combinations of process conditions, e.g., component concentrations, temperatures, pressures and other reaction ranges and conditions that can be used to optimize the product purity and performance obtained from the described process. Only reasonable and routine experimentation will be required to optimize such process conditions.

Example 1

Stable Deposition of Tin Pyrophosphate

In a first example, a tin pyrophosphate LLT material was deposited onto a silicon wafer by thermal evaporation. Pellets of tin pyrophosphate (Alfa Aesar, Ward Hill, Mass., USA) were prepared with a home-made pill press and stored in a 100° C. oven. The tin pyrophosphate pellets were placed in a 3 inch by 0.75 inch tungsten boat (S7-0.010 W, available from R. D. Mathis, Long Beach, Calif., USA), clamped between the two copper leads of an evaporative system. The vacuum chamber of the evaporator system was evacuated to an ultimate pressure of between $10^{-6}$ and $10^{-5}$ Torr, and the silicon wafer positioned out of the evaporation plume path. The power was adjusted to approximately 20 Watts and held for approximately 30 minutes to allow the tin pyrophosphate and tungsten boat to react. When current was applied, stable deposition rates as high as 15 Å per second were achieved.

Example 2

Formation of LLT Barrier from Tin Pyrophosphate

Figure 3:
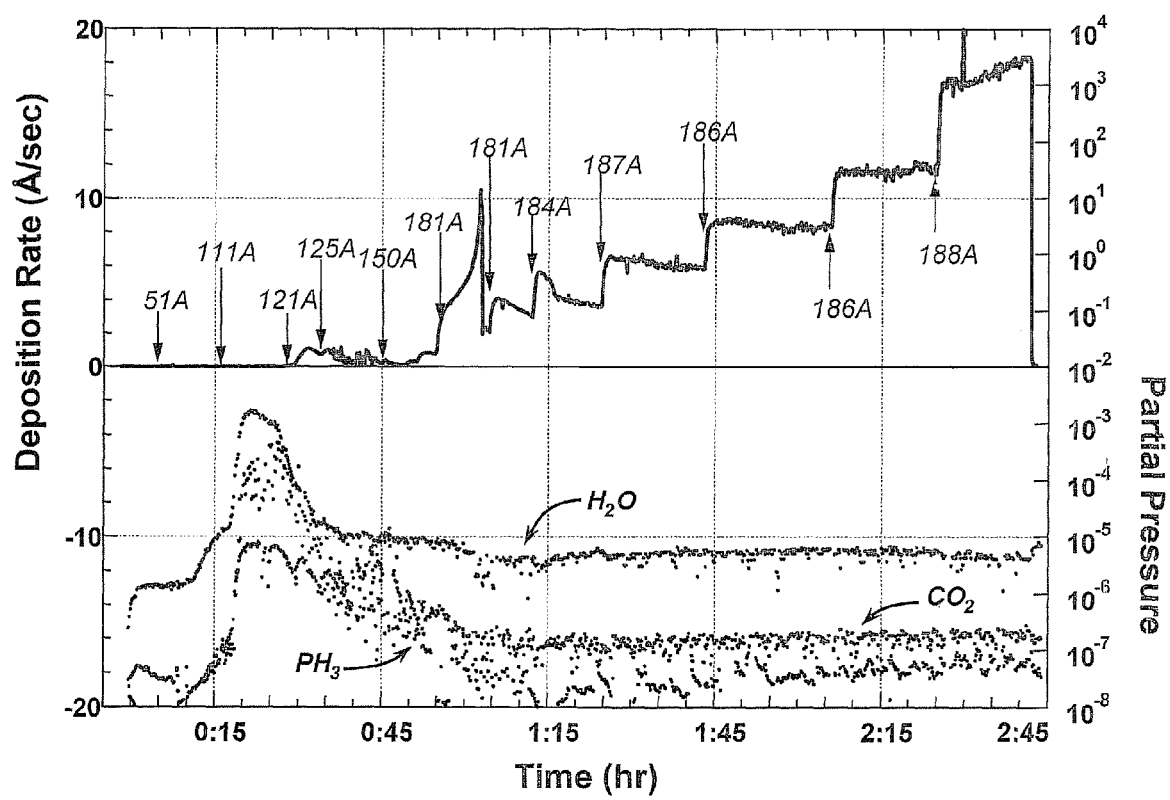
FIG. 3 illustrates the steady, stable, high deposition rate achievable for a tin pyrophosphate LLT starting material when utilizing a tungsten boat, in accordance with one aspect of the present invention.

In a second example, a tin pyrophosphate LLT material was deposited onto a calcium patch test device. Pellets of tin pyrophosphate were prepared and evaporated as in Example 1. The power was adjusted to 20 Watts and held for 30 minutes to allow the tin pyrophosphate and tungsten boat to react. Power was then increased to deliver 80 to 125 Watts to the tungsten boat. During evaporation, a residual gas analyzer monitored the vacuum chamber environment. As depicted in FIG. 3, a relatively low concentration of background gasses was present during evaporation. After an initial period, the power was adjusted to achieve a stable deposition rate of between 10 and 15 Å per second, at which time the test device was positioned in the evaporation plume path to deposit the LLT material.

After approximately 2 micrometers of LLT material were deposited, power to the resistive boat was stopped and an infrared lamp turned on, raising the temperature of the deposited layer to approximately 260° C. (bulk tin pyrophosphate glass has a glass transition temperature of approximately 247° C.). This temperature was maintained for 2 hours, effectively sintering the deposited layer and forming an impermeable layer. The test device was then subjected to an accelerated aging test as described in Example 4.

Example 3

Addition of Niobium Pentoxide

In a third example, a calcium patch test device, as in Example 2, was prepared and sealed with a LLT material. In this example, one mole percent of niobium pentoxide was added to the starting tin pyrophosphate material, prior to evaporation. Similar deposition rates to those of Example 2 were achieved. The test device was then subjected to an accelerated aging test as described in Example 6, the results of which are detailed in Table 1.

Example 4

Calcium Patch Accelerated Testing

In still another example, a calcium patch test device was prepared. The test device consisted of a Corning 1737 glass substrate (approximately 1 millimeter thick and 2.5 inches square), onto which a 100 nanometer thick calcium film (approximately 1 inch by 0.5 inch) was deposited, and onto which a 200 nanometer thick aluminum layer (approximately 1 inch by 0.5 inch) was deposited. The test device was affixed to moveable platform in the vacuum deposition chamber.

The calcium patch test device was subsequently sealed with a deposited tin pyrophosphate LLT material. The sealed device was then exposed to conditions designed to mimic long term operation of a device, such as an OLED. Industry standard conditions for accelerated aging require a device to withstand 1000 hours in an 85° C. and 85% relative humidity environment. Upon exposure to moisture or oxygen, by permeation through the LLT layer, the calcium reacts and changes from a highly reflective film to an opaque white crust. Optical photographs were acquired at regular time intervals to quantify the evolution of the test device and thus, determine the hermetic strength of the LLT layer. Table 1 below details calcium patch experiments on devices prepared as in examples above. The samples detailed in Table 1 are not necessarily the specific samples prepared in Examples 1-4, but were prepared in the same manner.

TABLE 1

Calcium Patch Accelerated Aging Test

| Sample | Starting LLT Material | Heat Treatment | Aging Test |
|---|---|---|---|
| Ex. 2 | $Sn_2P_2O_7$ | ~260° C./2 hrs | Passed |
| Ex. 2 duplicate | $Sn_2P_2O_7$ | ~260° C./2 hrs | Passed |
| Ex. 3 | $Sn_2P_2O_7$ + 1% $Nb_2O_5$ | ~260° C./2 hrs | Passed |

Examination of the data in Table 1 indicates that barrier layers formed from the evaporation of tin pyrophosphate using a tungsten heating element yielded good hermetic seals when heat treated to temperatures near the glass transition temperature of the LLT material for a period of 2 hours. An additional film was prepared according to Example 3, wherein the tin phosphate LLT starting material included 1 mole percent niobium pentoxide. Table 1 illustrates the ability to achieve good hermetic seals using a tin phosphate LLT material when a deposited film is heat treated to a temperature near the glass transition temperature of the LLT material.

Throughout this application, various publications are referenced. The disclosures of these publications in their entireties are hereby incorporated by reference into this application in order to more fully describe the compounds, compositions and methods described herein.

Various modifications and variations can be made to the compounds, compositions and methods described herein. Other aspects of the compounds, compositions and methods described herein will be apparent from consideration of the specification and practice of the compounds, compositions and methods disclosed herein. It is intended that the specification and examples be considered as exemplary.

What is claimed is:

1. A method of inhibiting oxygen and moisture penetration of a device, comprising the steps of:
    heating a tin phosphate starting material in a tungsten boat to react the tungsten of the boat with the tin phosphate starting material;
    evaporating the reacted tin phosphate starting material and at least a portion of the tungsten;
    depositing the reacted tin phosphate starting material and the at least a portion of the tungsten on the device to form a layer of tin phosphate low liquidus temperature inorganic material on the device;
    heat treating the tin phosphate low liquidus temperature inorganic material layer in a substantially oxygen and moisture free environment to form a hermetic seal; and
    wherein the deposited layer comprises from greater than 0 to about 10 wt. % tungsten.

2. The method of claim 1, wherein the hermetic seal comprises a single layer of tin phosphate low liquidus temperature inorganic material.

3. The method of claim 1, wherein the tin phosphate starting material comprises tin pyrophosphate.

4. The method of claim 1, wherein the tin phosphate starting material is substantially free of fluorine.

5. The method of claim 1, wherein the tin phosphate low liquidus temperature inorganic material comprises.

6. The method of claim 1, wherein the tin phosphate low liquidus temperature inorganic material layer is heat treated to a temperature within 50° C. of the tin phosphate low liquidus temperature inorganic material glass transition temperature.

7. The method of claim 1, wherein the tin phosphate starting material comprises tin meta-phosphate, tin ortho-hydrogen phosphate, tin ortho-dihydrogen phosphate or a combination thereof.

8. The method of claim 1, further comprising evaporating niobium oxide with the reacted tin phosphate starting material.

9. The method of claim 1, wherein the layer of tin phosphate low liquidus temperature inorganic material further comprises niobium.

10. The method of claim 1, wherein the layer of tin phosphate low liquidus temperature inorganic material comprises from about 60 mole percent to about 80 mole percent SnO.

11. A method of inhibiting oxygen and moisture penetration of a device, comprising the steps of:
    heating a tin phosphate starting material substantially free of fluorine in an electrically resistive heating element comprising tungsten, the heating comprising delivering a first electrical power to the resistive heating element to react the tungsten of the heating element with the tin phosphate starting material, then delivering a second electrical power to the resistive heating element greater than the first electrical power to volatilize the reacted tin phosphate starting material;
    depositing a tin phosphate low liquidus temperature inorganic material, resulting from volatilizing the reacted tin phosphate starting material, in a layer on at least a portion of the device;
    heat treating the layer in a substantially oxygen and moisture free environment to form a hermetic seal; and
    wherein the deposited layer comprises from greater than 0 to about 10 wt. % tungsten.

12. The method of claim 11, wherein the tin phosphate starting material comprises tin meta-phosphate, tin ortho-hydrogen phosphate, tin ortho-dihydrogen phosphate, tin pyrophosphate, or a mixture thereof.

13. The method of claim 11, wherein the tin phosphate low liquidus temperature inorganic material further comprises a tin oxide.

14. The method of claim 11, wherein the tin phosphate low liquidus temperature inorganic material comprises from about 60 mole percent to about 80 mole percent SnO.

15. The method of claim 11, wherein the tin phosphate low liquidus temperature inorganic material is substantially free of fluorine.

16. The method of claim 11, wherein the tin phosphate low liquidus temperature inorganic material further comprises a niobium compound.

17. The method of claim 11, wherein the device comprises at least one of
    an organic-electronic device;
    a thin-film sensor;
    an optoelectronic device;
    a photovoltaic device;
    a food container; or
    a medicine container.

18. The device produced by the method of claim 11.

19. The method of claim 11, wherein the tin phosphate low liquidus temperature inorganic material layer is heat treated to a temperature within 50° C. of the tin phosphate low liquidus temperature inorganic material glass transition temperature.

* * * * *